United States Patent
Kaigawa (10) Patent No.: US 8,466,020 B2
(45) Date of Patent: Jun. 18, 2013

(54) METHOD OF PRODUCING SEMICONDUCTOR DEVICE

(75) Inventor: Hiroyuki Kaigawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 22 days.

(21) Appl. No.: 13/321,418

(22) PCT Filed: Apr. 6, 2010

(86) PCT No.: PCT/JP2010/056223
§ 371 (c)(1),
(2), (4) Date: Nov. 18, 2011

(87) PCT Pub. No.: WO2010/134390
PCT Pub. Date: Nov. 25, 2010

(65) Prior Publication Data
US 2012/0058589 A1      Mar. 8, 2012

(30) Foreign Application Priority Data
May 20, 2009   (JP) .................................. 2009-121952

(51) Int. Cl.
*H01L 21/8234* (2006.01)
(52) U.S. Cl.
USPC ...................... 438/237; 438/59; 257/E21.411
(58) Field of Classification Search
USPC .................... 438/59, 237, 628; 257/E21.411
See application file for complete search history.

(56) References Cited

U.S. PATENT DOCUMENTS

| | | | |
|---|---|---|---|
| 5,501,989 A | 3/1996 | Takayama et al. | |
| 2002/0074551 A1 | 6/2002 | Kimura | |
| 2010/0140631 A1 | 6/2010 | Yamanaka et al. | |
| 2010/0308345 A1 | 12/2010 | Brown et al. | |

FOREIGN PATENT DOCUMENTS

| | | | |
|---|---|---|---|
| GB | 2446821 A | 8/2008 | |
| JP | 06-275806 A | 9/1994 | |
| JP | 06-275807 A | 9/1994 | |
| JP | 2005-328088 A | 11/2005 | |
| JP | 2009-065139 A | 3/2009 | |
| JP | 2009-130276 A | 6/2009 | |
| WO | 2008/096892 A1 | 8/2008 | |
| WO | 2008/133162 A1 | 11/2008 | |
| WO | WO 2008133162 A1 * | 11/2008 | |

* cited by examiner

*Primary Examiner* — Leonard Chang
(74) *Attorney, Agent, or Firm* — Chen Yoshimura LLP (57) ABSTRACT

Provided is a method of manufacturing a semiconductor device which can form a high-performance photodiode in which variation in output characteristics and performance deterioration are suppressed. A prescribed gate metal is used to form a shield section 34a that covers a portion of a first semiconductor layer 30a for a photodiode that becomes an intrinsic semiconductor region on a gate insulating film 29 and to form first to fourth gate electrodes 34b to 34e that cover portions of respective second to fifth semiconductor layers 30b to 30e for thin film transistors that become channel regions on the gate insulating film 29. Then, using the shield section 34a as a mask, an n-type region and p-type region are formed in the first semiconductor layer 30a. Then, the shield section 34a is removed.

7 Claims, 8 Drawing Sheets

| Variation factor | Step | Cause of variation | Conventional | | Present embodiment | |
|---|---|---|---|---|---|---|
| | | | Formula | Calculation example | Formula | Calculation example |
| Shield section | Exposure | Resist dimension | — | — | a | 0.3 |
| | | Alignment | — | — | — | — |
| | Etching | Etching shift | — | — | c | 0.5 |
| p-type region | Exposure | Resist dimension | a | 0.3 | — | — |
| | | Alignment | b | 0.7 | — | — |
| n-type region | Exposure | Resist dimension | a | 0.3 | — | — |
| | | Alignment | b | 0.7 | — | — |
| Dimensional variation of intrinsic semiconductor region | | | $(2(a^2+b^2))^{1/2}$ | 1.08 | $(a^2+c^2)^{1/2}$ | 0.58 |

(Unit: μm)

FIG. 9

METHOD OF PRODUCING SEMICONDUCTOR DEVICE

TECHNICAL FIELD

The present invention relates to a method of manufacturing a semiconductor device that is used in an active matrix substrate and the like.

BACKGROUND ART

In recent years, a liquid crystal display device, for example, has been widely used in a liquid crystal television, a monitor, a mobile phone, and the like as a flat panel display having characteristics, such as being thinner, lighter, and the like, than a conventional cathode ray tube television. As such liquid crystal display devices, those using an active matrix substrate are known. In such a liquid crystal display device, a plurality of data wirings (source wirings) and a plurality of scan wirings (gate wirings) are arranged in a matrix. In the proximity of an intersection of a data wiring and a scan wiring, a switching element such as a thin film transistor (TFT, hereinafter referred to as "TFT") or the like and a pixel having a pixel electrode that is connected to the switching element are arranged in a matrix.

In the aforementioned active matrix substrate, other than the aforementioned TFT for driving a pixel, a TFT for a peripheral circuit is integrally provided. Furthermore, when an active matrix substrate is used in a liquid crystal display device that is equipped with a touch panel, a liquid crystal display device that is equipped with an illuminance sensor (ambient sensor), or the like, there has been suggested that in addition to the aforementioned TFTs for driving a pixel and for a peripheral circuit, a photodiode (thin film diode: TFD) be provided in the active matrix substrate. Thus, the active matrix substrate is a semiconductor device that is equipped with a plurality of thin film transistors and a photodiode.

Furthermore, in the active matrix substrate, typically, TFTs having mutually different configurations are used as TFTs for driving a pixel and for a peripheral circuit.

Specifically, as a TFT for driving a pixel, a TFT having a very low OFF leakage current is used. In a liquid crystal display device, a voltage applied to liquid crystal needs to be sustained during one frame period until the screen is updated. This is because, in a liquid crystal display device, if the OFF current (OFF leakage current) of the TFT for driving a pixel is high, the voltage applied to liquid crystal decreases over time, causing a risk of display characteristics deterioration. As a result, as the TFT for driving a pixel, an n-channel type TFT, for example, having an LDD configuration in which a low-concentration impurity region (LDD region: Lightly Doped Drain) is formed at least either between a channel region and a source region of the TFT or between the channel region and a drain region, is typically used. In this LDD configuration, an LDD region having a higher resistance than the source region and the drain region is provided between an edge of a gate electrode and the source region having a low resistance and between the edge and the drain region. This way, when the aforementioned LDD configuration is used, the OFF leakage current can be reduced significantly compared to a so-called single drain configuration TFT, which does not have an LDD region.

On the other hand, as a TFT for a peripheral circuit, a TFT having a high current driving power, i.e., a high ON current, is used. Specifically, as the TFT for a peripheral circuit, an n-channel type TFT having a GOLD (Gate Overlapped LDD) configuration, for example, is used. In this GOLD configuration TFT, a gate electrode overlaps an LDD region. Therefore, when a voltage is applied to the gate electrode, electrons that become carriers are accumulated in the LDD region overlapped by the gate electrode. As a result, in the aforementioned GOLD configuration TFT, the resistance of the LDD region can be reduced. Thus, lowering of current driving power of the TFT can be suppressed, and the ON current can be increased.

Alternatively, in the active matrix substrate, an n-channel type TFT and a p-channel type TFT having the aforementioned single drain configuration are also used as TFTs for a peripheral circuit.

As a conventional method of manufacturing a semiconductor device, as discussed in Japanese Patent Application Laid-Open Publication No. 2005-328088, for example, there has been proposed that TFTs corresponding to various circuits of an active matrix substrate be formed on a single substrate. Specifically, in this conventional method of manufacturing a semiconductor device, an n-channel type TFT for driving a pixel having the LDD configuration, a p-channel type TFT for a peripheral circuit having the single drain configuration, and an n-channel type TFT for a peripheral circuit having either the LDD configuration or the GOLD configuration are formed on a single substrate.

Furthermore, as a conventional method of manufacturing a semiconductor device, as discussed in WO 2008/133162 pamphlet, for example, there has been proposed that an active matrix substrate in which a photodiode and a TFT are monolithically provided be formed. In addition, the WO 2008/133162 pamphlet shows a photodiode formed of a PIN diode that is equipped with a lateral configuration. Furthermore, according to the conventional method of manufacturing a semiconductor device, variation in length of an intrinsic semiconductor region in a forward direction (i.e., channel length) can be suppressed by providing two metal wires above the intrinsic semiconductor region (i-layer). As a result, variation in output characteristics of the photodiode can be also suppressed.

SUMMARY OF THE INVENTION

However, according to the method of manufacturing a semiconductor device discussed in the aforementioned WO 2008/133162 pamphlet, there has been a risk of performance of the photodiode deteriorating due to the two metal wires, which are provided above the intrinsic semiconductor region.

Specifically, in a semiconductor device that is produced by the manufacture method discussed in the aforementioned WO 2008/133162 pamphlet, since light is blocked by the metal wires, there has been a risk of the light receiving area of an intrinsic semiconductor region that constitutes a light detection area becoming smaller, thereby causing a photocurrent to be reduced. Moreover, in the semiconductor device produced by the aforementioned manufacture method, there has been a risk of an interference of light that was reflected by metal wires and light entering the photodiode (intrinsic semiconductor region) occurring, thereby decreasing the amount of light entering the intrinsic semiconductor region. As described, in the semiconductor device produced by the aforementioned manufacture method, there has been a risk of detection accuracy of the photodiode lowering.

Furthermore, in the method of manufacturing a semiconductor device discussed in the aforementioned WO 2008/133162 pamphlet, the respective metal wires are formed using dry etching so that edges of the respective metal wires are located above the intrinsic semiconductor region. Because of this, there has been a risk that an etching damage caused by the dry etching is left in the intrinsic semiconductor region. Thus, there has been a risk of an S/N ratio lowering in output of the photodiode.

In order to address the aforementioned problems, an object of the present invention is to provide a method of manufacturing a semiconductor device that can form a high performance photodiode that suppresses variation in output characteristics and performance deterioration.

In order to achieve the aforementioned object, a method of manufacturing a semiconductor device according to an embodiment of the present invention is a method of manufacturing a semiconductor device having a photodiode and a thin film transistor on the same substrate, including the following steps: (a) forming a first semiconductor layer for the photodiode and a second semiconductor layer for the thin film transistor on the substrate; (b) forming a gate insulating film that covers the first and second semiconductor layers; (c) forming a first gate electrode that covers a portion of the second semiconductor layer that becomes a channel region on the gate insulating film using a prescribed gate metal, and forming a shield section that covers a portion of the first semiconductor layer that becomes an intrinsic semiconductor region on the gate insulating film using the gate metal; (d) implanting a first conductive type impurity into the first and second semiconductor layers from above the gate insulating film to form a region where the first conductive type impurity is implanted in a region of the first semiconductor layer that is not covered by the shield section and to form a region where the first conductive type impurity is implanted in a region of the second semiconductor layer that is not covered by the first gate electrode; (e) forming a first resist having an opening that exposes a portion of the gate insulating film, which covers the first semiconductor layer, and implanting a second conductive type impurity from above the gate insulating film to form a second conductive type region in a region of the first semiconductor layer that is not covered by the shield section or the first resist; (f) forming a second resist that covers the second conductive type region of the first semiconductor layer and implanting the first conductive type impurity from above the gate insulating film to form a first conductive type region in a region of the first semiconductor layer that is not covered by the shield section or the second resist; and (g) removing the shield section.

According to the present invention, a method of manufacturing a semiconductor device that can form a high performance photodiode that suppresses variation in output characteristics and performance deterioration can be provided.

BRIEF DESCRIPTION OF THE DRAWINGS

FIG. 5(a) to FIG. 5(c) explain a set of main process steps.

FIG. 6(a) to FIG. 6(c) explain a set of main process steps performed after the step shown in FIG. 5(c).

FIG. 7(a) to FIG. 7(c) explain a set of main process steps performed after the step shown in FIG. 6(c).

FIG. 8(a) to FIG. 8(c) explain a set of main process steps performed after the step shown in FIG. 7(c).

DETAILED DESCRIPTION OF EMBODIMENTS

A method of manufacturing a semiconductor device according to an embodiment of the present invention is a method of manufacturing a semiconductor device having a photodiode and a thin film transistor on the same substrate, which includes the following steps: (a) forming a first semiconductor layer for the photodiode and a second semiconductor layer for the thin film transistor on the substrate; (b) forming a gate insulating film that covers the first and second semiconductor layers; (c) forming a first gate electrode that covers a portion of the second semiconductor layer that becomes a channel region on the gate insulating film using a prescribed gate metal, and forming a shield section that covers a portion of the first semiconductor layer that becomes an intrinsic semiconductor region on the gate insulating film using the gate metal; (d) implanting a first conductive type impurity into the first and second semiconductor layers from above the gate insulating film to form a region where the first conductive type impurity is implanted in a region of the first semiconductor layer that is not covered by the shield section and to form a region where the first conductive type impurity is implanted in a region of the second semiconductor layer that is not covered by the first gate electrode; (e) forming a first resist having an opening that exposes a portion of the gate insulating film, which covers the first semiconductor layer, and implanting a second conductive type impurity from above the gate insulating film to form a second conductive type region in a region of the first semiconductor layer that is not covered by the shield section or the first resist; (f) forming a second resist that covers the second conductive type region of the first semiconductor layer and implanting the first conductive type impurity from above the gate insulating film to form a first conductive type region in a region of the first semiconductor layer that is not covered by the shield section or the second resist; and (g) removing the shield section.

In each of the respective steps of forming the first and second conductive type regions of the photodiode, if a resist is formed on a region that becomes an intrinsic semiconductor region, dimensional accuracy of the intrinsic semiconductor region is affected by dimensional accuracy and alignment of the respective resists. In contrast, in the aforementioned method of manufacturing a semiconductor device, a shield section is formed to cover a portion of the photodiode that becomes the intrinsic semiconductor region using a gate metal. As a result, in the aforementioned method of manufacturing a semiconductor device, only dimensional variation of the shield section and errors during etching affect variation in the dimension of the intrinsic semiconductor region. Therefore, variation in the length of the intrinsic semiconductor region in the forward direction, i.e., the channel length variation of the photodiode, is reduced. As a result, variation in output characteristics of the photodiode can be suppressed.

Furthermore, according to the aforementioned method of manufacturing a semiconductor device, the first and second conductive type regions are formed in the first semiconductor layer using the shield section as a resist (mask), and then, the shield section is removed. This way, decrease in the light receiving area of the intrinsic semiconductor region and decrease in the amount of light entering the intrinsic semiconductor region, which occur in the aforementioned conventional example, can be prevented. Therefore, according to the aforementioned method, decrease in photocurrent flowing into the photodiode can be prevented. Furthermore, even when the shield section is formed using dry etching, etching damages at edges of the shield section are on the first and second conductive type regions. Therefore, lowering of the S/N ratio does not occur in output of the photodiode.

As a result, a high performance photodiode that suppresses variation in output characteristics of the photodiode and that suppresses performance deterioration of the photodiode can be formed.

In the aforementioned method of manufacturing a semiconductor device, in the step (e), a third resist that entirely covers the second semiconductor layer may be formed to prevent the second conductive type impurity from being implanted into the second semiconductor layer, and in the step (f), a fourth resist having an opening that exposes portions of the gate insulating film that are located on both sides of the second semiconductor layer with the gate electrode located therebetween in a plan view may be formed so that one and the other of a source region and a drain region may be respectively formed in regions of both sides of the second semiconductor layer that are not covered by the first gate electrode or the fourth resist, and a region of the second semiconductor layer that is covered by the fourth resist may become a low-concentration impurity region to form a first conductive type thin film transistor having an LDD configuration as the first of the thin film transistor. In this case, the first conductive type thin film transistor having an LDD configuration can be formed at the same time as the photodiode.

In the aforementioned method of manufacturing a semiconductor device, in the step (a), a third semiconductor layer for a second thin film transistor may be formed on the substrate. In the step (b), a gate insulating film that covers the first to third semiconductor layers may be formed. Before performing the step (c), the method may further include a step (h) of forming fifth and sixth resists that respectively cover the first and second semiconductor layers entirely and forming a seventh resist that covers a portion of the third semiconductor layer that becomes a channel region, and implanting a first conductive type impurity into the third semiconductor layer from above the gate insulating film to form a region in which the first conductive type impurity is implanted in a region of the third semiconductor layer that is not covered by the seventh resist. In the step (c), a second gate electrode that covers portions of the third semiconductor layer that become a channel region and a low-concentration impurity region may be formed on the gate insulating film using the gate metal. In the step (d), the channel region and the low-concentration impurity region may be formed in a region that is covered by the second gate electrode. In the step (e), an eighth resist that entirely covers the third semiconductor layer may be formed to prevent the second conductive type impurity from being implanted to the third semiconductor layer, and in the step (f), one and the other of a source region and a drain region may be respectively formed in regions of the third semiconductor layer that are not covered by the second gate electrode to form a first conductive type thin film transistor having a GOLD configuration as the second thin film transistor. In this case, the first conductive type thin film transistor having the GOLD configuration can be formed at the same time as the photodiode.

In the aforementioned method of manufacturing a semiconductor device, in the step (a), a fourth semiconductor layer for a third thin film transistor may be formed on the substrate. In the step (b), a gate insulating film that covers the first to fourth semiconductor layers may be formed. In the step (h), a ninth resist that entirely covers the fourth semiconductor layer may be formed. In the step (c), a third gate electrode that covers a portion of the fourth semiconductor layer that becomes a channel region may be formed on the gate insulating film using the gate metal. In the step (d), a region in which the first conductive type impurity is implanted may be formed in a region of the fourth semiconductor layer that is not covered by the third gate electrode. In the step (e), a tenth resist that entirely covers the fourth semiconductor layer may be formed to prevent the second conductive type impurity from being implanted to the fourth semiconductor layer, and in the step (f), one and the other of a source region and a drain region may be respectively formed in regions of the fourth semiconductor layer that are not covered by the third gate electrode to form a first conductive type thin film transistor having a Single Drain configuration as the third thin film transistor. In this case, the first conductive type thin film transistor having a Single Drain configuration can be formed at the same time as the photodiode.

In the aforementioned method of manufacturing a semiconductor device, in the step (a), a fifth semiconductor layer for a fourth thin film transistor may be formed on said substrate. In the step (b), a gate insulating film that covers the first to fifth semiconductor layers may be formed. In the step (h), an eleventh resist that entirely covers the fifth semiconductor layer may be formed. In the step (c), a fourth gate electrode that covers a portion of the fifth semiconductor layer that becomes a channel region may be formed on the gate insulating film using the gate metal. In the step (d), a region in which the first conductive type impurity is implanted may be formed in a region of the fifth semiconductor layer that is not covered by the fourth gate electrode. In the step (e), one and the other of a source region and a drain region may be respectively formed in regions of the fifth semiconductor layer that are not covered by the fourth gate electrode to form a second conductive type thin film transistor as the fourth thin film transistor. In the step (f), a twelfth resist that entirely covers the fifth semiconductor layer may be formed to prevent the first conductive type impurity from being implanted to the fifth semiconductor layer. In this case, a second conductive type thin film transistor can be formed at the same time as the photodiode.

In the aforementioned method of manufacturing a semiconductor device, in the step (c), after the gate metal is formed on the gate insulating film so as to entirely cover the first to fifth semiconductor layers, thirteenth, fourteenth, fifteenth, sixteenth, and seventeenth resists may be formed at portions that become the shield section, the first, the second, the third, and the fourth gate electrodes, respectively. Then, a prescribed etching treatment may be performed to form the shield section and the first to fourth gate electrodes on the gate insulating film. In this case, the shield section and the first to fourth gate electrodes can be formed at appropriate locations with ease.

In the aforementioned method of manufacturing a semiconductor device, after the step (b), the method may further include a step (i) of implanting the first or the second conductive type impurity into the first to the fifth semiconductor layers from above the gate insulating film to adjust the resistance of the respective first to fourth thin film transistors. In this case, the resistance of the respective first to fourth thin film transistors can be set at appropriate values with ease.

In the aforementioned method of manufacturing a semiconductor device, after the step (g), the method may further include a step (j) of implanting the first or the second conductive type impurity into the first semiconductor layer from above the gate insulating film to adjust the resistance of the photodiode. In this case, the resistance of the photodiode can be set to an appropriate value with ease.

In the aforementioned method of manufacturing a semiconductor device, the first conductive type may be an n-type, and the second conductive type may be a p-type. In this case, a lateral configuration photodiode and an n-type and/or a p-type thin film transistor can be integrally formed.

Embodiment

A method of manufacturing a semiconductor device according to an embodiment of the present invention is described below with reference to figures. In the description below, a case in which the present invention is applied to an active matrix substrate that is used in a liquid crystal display device having a touch panel is shown as an example. Dimensions of components in the respective figures do not show the exact dimensions of the actual components, dimensional ratio of the respective components, and the like.

Figure 1:
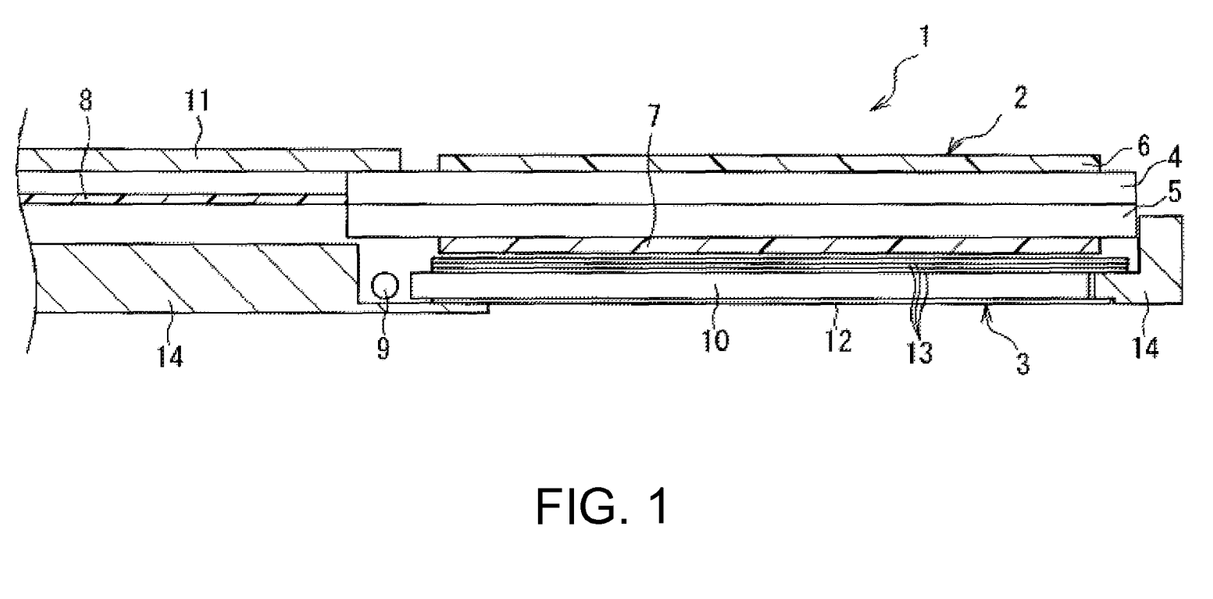
FIG. 1 is a drawing explaining a configuration of a liquid crystal display device according to an embodiment of the present invention.

FIG. 1 is a drawing explaining a configuration of a liquid crystal display device according to an embodiment of the present invention. In FIG. 1, a liquid crystal display device 1 according to the present embodiment has a liquid crystal panel 2, which is a display section that is disposed with the upper side of FIG. 1 as the viewing side (display surface side), and an illumination device 3, which is an illumination section that is disposed on the non-display surface side (lower side of FIG. 1) of the liquid crystal panel 2 and that irradiates the liquid crystal panel 2 with illumination light. Furthermore, a touch panel that is equipped with an optical sensor, which is described later, is integrally built into the liquid crystal display device 1. The liquid crystal display device 1 is configured such that prescribed touch panel functions, such as detecting operation of operational input command by a user and the like, can be performed by the touch panel.

The liquid crystal panel 2 has a color filter substrate 4 and an active matrix substrate 5, which constitute a pair of substrates, and polarizing plates 6 and 7 that are disposed so as to cover the color filter substrate 4 and the active matrix substrate 5, which overlap with each other, from both sides. Between the color filter substrate 4 and the active matrix substrate 5, a liquid crystal layer, which is described later, is interposed. The polarizing plate 6, 7 is attached to the corresponding color filter substrate 4 or active matrix substrate 5 to cover at least an effective display region of the display surface provided in the liquid crystal panel 2.

Between the active matrix substrate 5 and the liquid crystal layer, pixel electrodes, thin film transistors (hereinafter abbreviated as "TFTs"), and the like, which correspond to a plurality of pixels included in the display surface of the liquid crystal panel 2, are formed (described in detail later). The active matrix substrate 5, as described later, is a semiconductor device in which photodiodes (thin film diodes: TFDs) and TFTs of a plurality of types are monolithically formed.

Between the color filter substrate 4 and the liquid crystal layer, a color filter, which is described later, an opposite electrode, and the like are formed.

Furthermore, the liquid crystal panel 2 is equipped with an FPC (Flexible Printed Circuit) 8 that is connected to a control device (not shown in the figure) that controls drive of the liquid crystal panel 2. As described, the liquid crystal display device 1 can display a desired image on the display surface of the liquid crystal panel 2 by operating the liquid crystal layer on a pixel by pixel basis.

The illumination device 3 has a cold cathode fluorescent lamp 9 as the light source and a light guide plate 10 that is disposed to face the cold cathode fluorescent lamp 9. Furthermore, in the illumination device 3, in a state in which the liquid crystal panel 2 is disposed on the viewing side of the light guide plate 10, the cold cathode fluorescent lamp 9 and the light guide plate 10 are supported by a bezel 14. On the color filter substrate 4, a case 11 is arranged. This way, the illumination device 3 is built into the liquid crystal panel 2 to be unified with the liquid crystal panel 2. Thus, the illumination device 3 and the liquid crystal panel 2 constitute the transmissive liquid crystal display device 1 in which illumination light from the illumination device 3 enters the liquid crystal panel 2.

Light from the cold cathode fluorescent lamp 9 enters the light guide plate 10, which is formed of a synthetic resin, such as a transparent polycarbonate resin or the like, for example. On the light guide plate 10, a reflection sheet 12 is disposed on the surface opposite from the liquid crystal panel 2. In addition, on the surface of the light guide plate 10 on the liquid crystal panel 2 side, optical sheets 13, such as a lens sheet, a diffusion sheet, and the like, are provided. The cold cathode fluorescent lamp 9, the light guide plate 10, the reflection sheet 12, and the optical sheets 13 function as a planar light source that irradiates the liquid crystal panel 2 with light.

Figure 2:
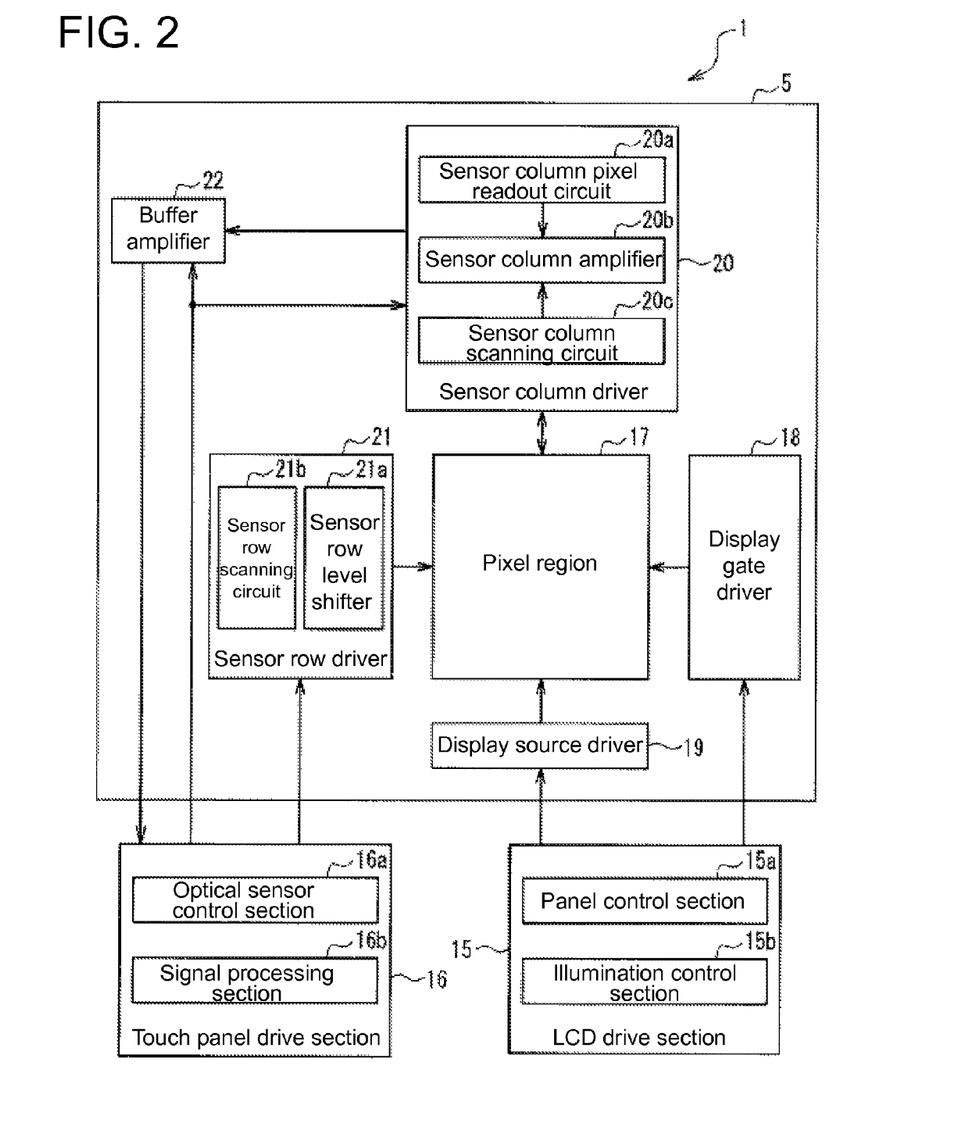
FIG. 2 is a drawing explaining a configuration of basic parts of the aforementioned liquid crystal display device.
Figure 3:
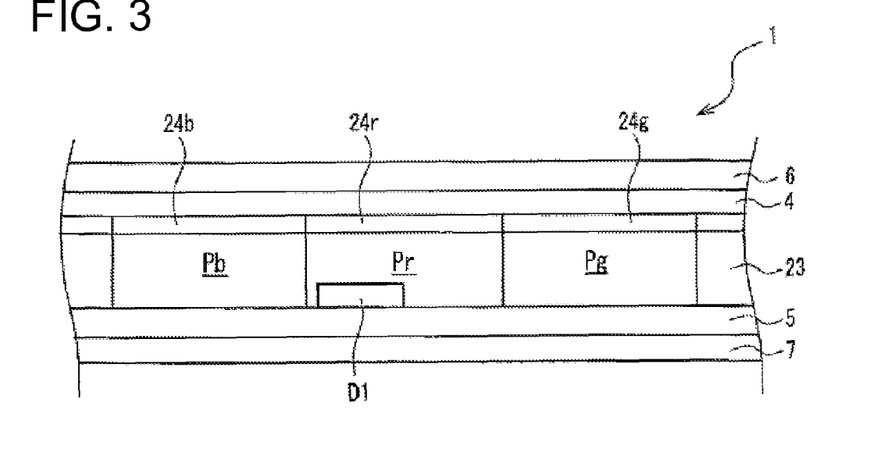
FIG. 3 is a drawing schematically showing a configuration of pixels of the aforementioned liquid crystal display device.
Figure 4:
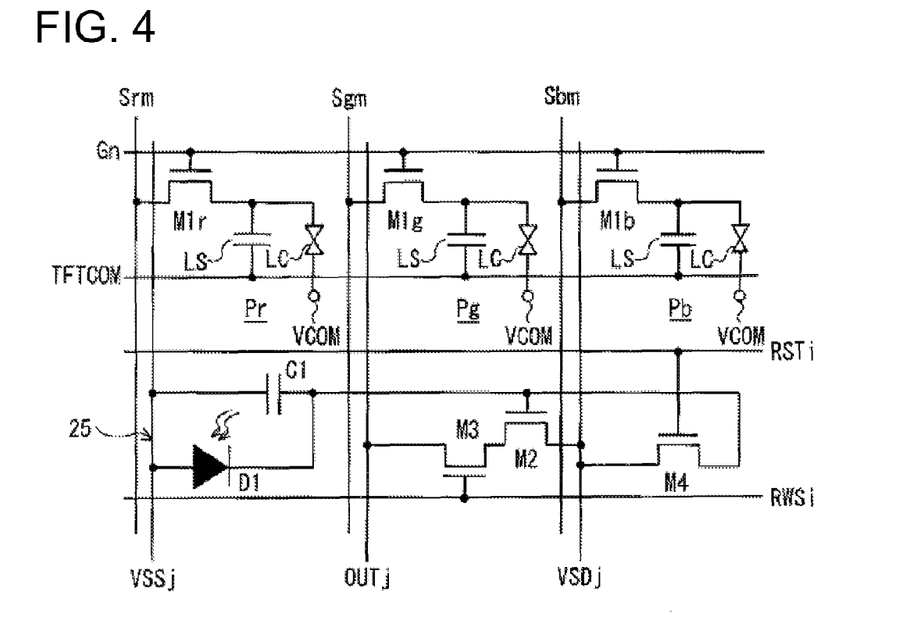
FIG. 4 is an equivalent circuit diagram showing a configuration of pixels and an optical sensor provided in the aforementioned liquid crystal display device.

Next, with reference to FIGS. 2 to 4, each component of the liquid crystal display device 1 of the present embodiment is described in detail.

FIG. 2 is a drawing explaining a configuration of primary parts of the liquid crystal display device 1. FIG. 3 is a magnified cross-sectional view showing a specific configuration of a pixel of the liquid crystal display device 1. FIG. 4 is an equivalent circuit diagram showing a configuration of a pixel and an optical sensor provided in the liquid crystal display device 1.

As shown in FIG. 2, in the liquid crystal display device 1 of the present embodiment, a pixel region 17, a display gate driver 18, a display source driver 19, a sensor column driver 20, a sensor row driver 21, and a buffer amplifier 22 are provided on the active matrix substrate 5. The display gate driver 18 and the display source driver 19 are connected to an LCD drive section 15 through an FPC (Flexible Printed Circuit), which is not shown in the figure. The sensor column driver 20, the sensor row driver 21, and the buffer amplifier 22 are connected to a touch panel drive section 16 through another FPC (not shown in the figure).

The aforementioned respective components on the active matrix substrate 5 may be monolithically formed on a transparent substrate such as a transparent glass substrate or the like. Alternatively, among the aforementioned respective components, a driver or the like may be mounted on the transparent substrate by a COG (Chip On Glass) technique or the like, for example.

The configuration may not be limited to the aforementioned configuration. A single FPC may be used to connect the display gate driver 18 and the display source driver 19 to the LCD drive section 15 and to connect the sensor column driver 20, the sensor row driver 21, and the buffer amplifier 22 to the touch panel drive section 16.

The pixel region 17 constitutes the display surface of the liquid crystal panel 2, and is provided with a plurality of pixels arranged in a matrix. In addition, the pixel region 17 is provided with an optical sensor for each pixel unit.

Specifically, as shown in FIG. 3, in the liquid crystal panel 2, color filters 24r, 24g, and 24b of red (R), green (G), and blue (B), respectively, are formed on the surface of the color filter substrate 4 on the liquid crystal layer 23 side. In the liquid crystal panel 2, pixels Pr, Pg, and Pb of the respective colors RGB are provided corresponding to the color filters of the respective colors 24r, 24g, and 24b.

On the other hand, on the active matrix substrate 5, a switching element, which is described later, is formed for each pixel. Furthermore, the active matrix substrate 5 is provided with a light-receiving element (photodiode D1) of an optical sensor 25 in addition to the aforementioned switching element in the pixel region. As shown in FIG. 3, the light-receiving element of the optical sensor 25 is provided in the pixel Pr, for example, among pixels Pr, Pg, and Pb, and receives light entering from outside the display surface. FIG. 3 schematically shows a configuration of a pixel, and is different from the configuration of the actual cross-section.

In the aforementioned touch panel, the light-receiving element of the optical sensor 25 receives reflected light from a reflection object (detection object) such as a finger or the like to perform a coordinate detecting operation in which the optical sensor 25 detects coordinates (location) indicated by a touch operation of a user or the like. In the touch panel, a prescribed touch panel operation, such as a detecting operation of an operational input command by a user or the like is performed using the results of the coordinate detecting operation.

As shown in FIG. 4, in the pixel region 17, a gate line Gn and source lines Srm, Sgm, and Sbm arranged in a matrix are provided as wirings for pixels. The gate line Gn is connected to the display gate driver 18. The source lines Srm, Sgm, and Sbm correspond to the respective colors of RGB, and are respectively connected to the display source driver 19.

At intersections of the gate line Gn and the source lines Srm, Sgm, and Sbm, thin film transistors (TFTs) M1r, M1g, and M1b for driving pixels are provided respectively. In the pixel Pr, the gate electrode of the thin film transistor M1r is connected to the gate line Gn; the source electrode is connected to the source line Srm; and the drain electrode is connected to the pixel electrode, which is not shown in the figure, respectively. This way, as shown in FIG. 4, in the pixel Pr, a liquid crystal capacitance LC is formed between the drain electrode of the thin film transistor M1r and an opposite electrode (VCOM). Furthermore, an auxiliary capacitance LS is formed parallel to the liquid crystal capacitance LC. Here, the aforementioned respective thin film transistors M1r, M1g, and M1b, as described in detail later, are constituted of n-type (n-channel) TFTs having an LDD configuration, for example.

Similarly, also in the pixel Pg, the gate electrode of the thin film transistor M1g is connected to the gate line Gn; the source electrode is connected to the source line Sgm; and the drain electrode is connected to the pixel electrode, which is not shown in the figure, respectively. This way, as shown in FIG. 4, in the pixel Pg, a liquid crystal capacitance LC is also formed between the drain electrode of the thin film transistor M1g and an opposite electrode (VCOM). Furthermore, an auxiliary capacitance LS is formed parallel to the liquid crystal capacitance LC.

Also, in the pixel Pb, the gate electrode of the thin film transistor M1b is connected to the gate line Gn; the source electrode is connected to the source line Sbm; and the drain electrode is connected to the pixel electrode, which is not shown in the figure, respectively. This way, as shown in FIG. 4, in the pixel Pb, a liquid crystal capacitance LC is also formed between the drain electrode of the thin film transistor M1b and an opposite electrode (VCOM). Furthermore, an auxiliary capacitance LS is formed parallel to the liquid crystal capacitance LC.

To the respective pixels Pr, Pg, and Pb, voltage signals (gradation voltages) according to the luminance (gradation) of the respective pixels when information is displayed on the aforementioned display surface are supplied from the display source driver 19 through the source lines Srm, Sgm, and Sbm, which correspond to the respective pixels Pr, Pg, and Pb.

Thus, as shown in FIG. 2, the LCD drive section 15 is provided with a panel control section 15a and an illumination control section 15b. To the panel control section 15a, image signals of information to be displayed on the display surface are inputted from outside the liquid crystal display device 1. The panel control section 15a generates the respective command signals to output to the display gate driver 18 and the display source driver 19 according to the inputted image signals.

This way, the display gate driver 18 sequentially outputs gate signals for turning on the gate electrode of the corresponding thin film transistors M1r, M1g, and M1b to a plurality of gate lines Gn based on the command signal from the panel control section 15a. On the other hand, the display source driver 19 supplies the aforementioned gradation voltages to the respective pixels Pr, Pg, and Pb through the corresponding source lines Srm, Sgm, and Sbm, based on the command signal from the panel control section 15a.

To the illumination control section 15b, an illumination adjustment command signal that instructs a change in luminance of the aforementioned illumination light is inputted from a controller or the like provided in the liquid crystal display device 1. The illumination control section 15b is configured such that it controls power supplied to the cold cathode fluorescent lamp 9 of the illumination device 3 based on the inputted illumination adjustment command signal.

Going back to FIG. 4, the optical sensor 25 has the photodiode D1, which is the aforementioned light-receiving element, a capacitor C1, and thin film transistors M2 to M4. Furthermore, in the optical sensor 25, a constant voltage is supplied from the sensor column driver 20 through wires VSSj and VSDj that are provided parallel to the source lines Srm and Sbm, respectively. Furthermore, the optical sensor 25 is configured such that it outputs detection results to a sensor column pixel readout circuit 20a of the sensor column driver 20 through a wire OUTj arranged parallel to the source line Sgm. The photodiode D1, as described in detail later, is constituted of a PIN photodiode of a lateral structure.

A wire RSTi for supplying reset signals is connected to the thin film transistor M4. A wire RWSi for supplying readout signals is connected to the thin film transistor M3. These wires RSTi and RWSi are connected the sensor row driver 21.

As shown in FIG. 2, the sensor column driver 20 has the sensor column pixel readout circuit 20a, a sensor column amplifier 20b, and a sensor column scanning circuit 20c. The sensor column driver 20 operates according to command signals from the optical sensor control section 16a of the touch panel drive section 16. Detection results (voltage signals) of the plurality of optical sensors 25 arranged in a matrix in the pixel region 17 are successively inputted to the sensor column pixel readout circuit 20a through the wire OUTj. The sensor column pixel readout circuit 20a outputs the inputted voltage signals to the sensor column amplifier 20b.

The sensor column amplifier 20b has a plurality of built-in amplifiers (not shown in the figure) provided corresponding to the plurality of optical sensors 25, and amplifies the corresponding voltage signals to output to the buffer amplifier 22. The sensor column scanning circuit 20c outputs column selecting signals for successively connecting the plurality of amplifiers of the sensor column amplifier 20b to the buffer amplifier 22 to the sensor column amplifier 20b according to command signals from the optical sensor control section 16a. This way, voltage signals after amplification are outputted from the sensor column amplifier 20b to the touch panel drive section 16 side through the buffer amplifier 22.

The sensor row driver 21 is provided with a sensor row level shifter 21a that uses a shift register and a sensor row scanning circuit 21b. The sensor row scanning circuit 21b successively selects the wires RSTi and RWSi with a prescribed time interval according to command signals from the optical sensor control section 16a. This way, in the pixel region 17, the optical sensor 25 from which the readout voltage signal is to be read out (detection results) is successively selected row by row.

Here, a case in which a single optical sensor 25 is provided for a set of RGB pixels Pr, Pg, and Pb in the pixel region 17 was described. However, the number of the optical sensor 25 disposed in the pixel region 17, locations where components such as the photodiode D1 and the like included in the optical sensor 25 are arranged, and the like are not limited to the aforementioned configuration, and can be selected flexibly. For example, a photodiode (light receiving element) D1 that performs actual light detection may be provided in each of the pixels Pr, Pg, and Pb to have a configuration in which the optical sensor 25 is provided for each pixel.

As shown in FIG. 2, the touch panel drive section 16 has the optical sensor control section 16a and a signal processing section 16b. The touch panel drive section 16 controls drive of each of the plurality of optical sensors 25, and based on the respective detection results of the plurality of optical sensors 25, performs a prescribed touch panel operation, such as detection of an operational input command by a touch operation of a user or the like.

When the power of the liquid crystal display device 1 is turned on, for example, the optical sensor control section 16a outputs a drive command signal to the sensor column driver 20 and the sensor row driver 21 so that the optical sensor 25 performs a sensing operation. Thus, when the liquid crystal display device 1 is in operation, the optical sensor control section 16a makes the optical sensors 25 perform a coordinate detecting operation to detect a touch operation by a user. Detection results of the optical sensors 25 are stored in a memory (not shown in the figure) provided in the touch panel drive section 16.

The signal processing section 16b is configured such that it executes a prescribed touch panel operation including detecting operation of an operational input command by a user. Specifically, the signal processing section 16b obtains location (coordinates) information of a finger of a user or the like on the display surface of the aforementioned liquid crystal panel using detection results (i.e., coordinate detecting operation results) of the optical sensor 25 stored in the aforementioned memory. When a user's finger is placed on a desired location of an operation input screen (command input screen, for example) displayed on the liquid crystal panel 2, light emitted from the liquid crystal panel 2 side is reflected by the finger to the liquid crystal panel 2 side. The optical sensors 25 that are located near a location directly below the desired location detect the reflected light. Then, based on the location of the optical sensors 25, which detected the reflected light, the signal processing section 16b obtains positional information of the touch operation location of the user on the command input screen. Detecting operation of an operational input command by a user is performed this way in the liquid crystal display device 1 of the present embodiment.

The configuration is not limited to the aforementioned configuration. A configuration in which a scanning operation that scans image information is performed by a touch panel may be adopted.

Here, the touch panel drive section 16, the sensor column driver 20, the sensor row driver 21, the buffer amplifier 25, and the optical sensor 25 are built into the liquid crystal display device 1 of the present embodiment to constitute a touch panel that performs a prescribed touch panel function.

With reference to FIGS. 5 to 8, a method of manufacturing the active matrix substrate 5 according to the present embodiment is described in detail. Below, a manufacture method in which a photodiode that is constituted of the aforementioned PIN diode, an n-channel type (n-type) TFT of LDD configuration, an n-channel type (n-type) TFT of GOLD configuration, and n-channel type (n-type) and p-channel type (p-type) TFTs of single drain configuration are provided on a single substrate is described as an example. The aforementioned thin film transistor for driving pixels is an n-channel type (n-type) TFT of LDD configuration. A thin film transistor for a peripheral circuit is an n-channel type (n-type) TFT of GOLD configuration, an n-channel type (n-type) TFT of Single Drain configuration, or a p-channel type (p-type) TFT of Single Drain configuration.

Figure 5:
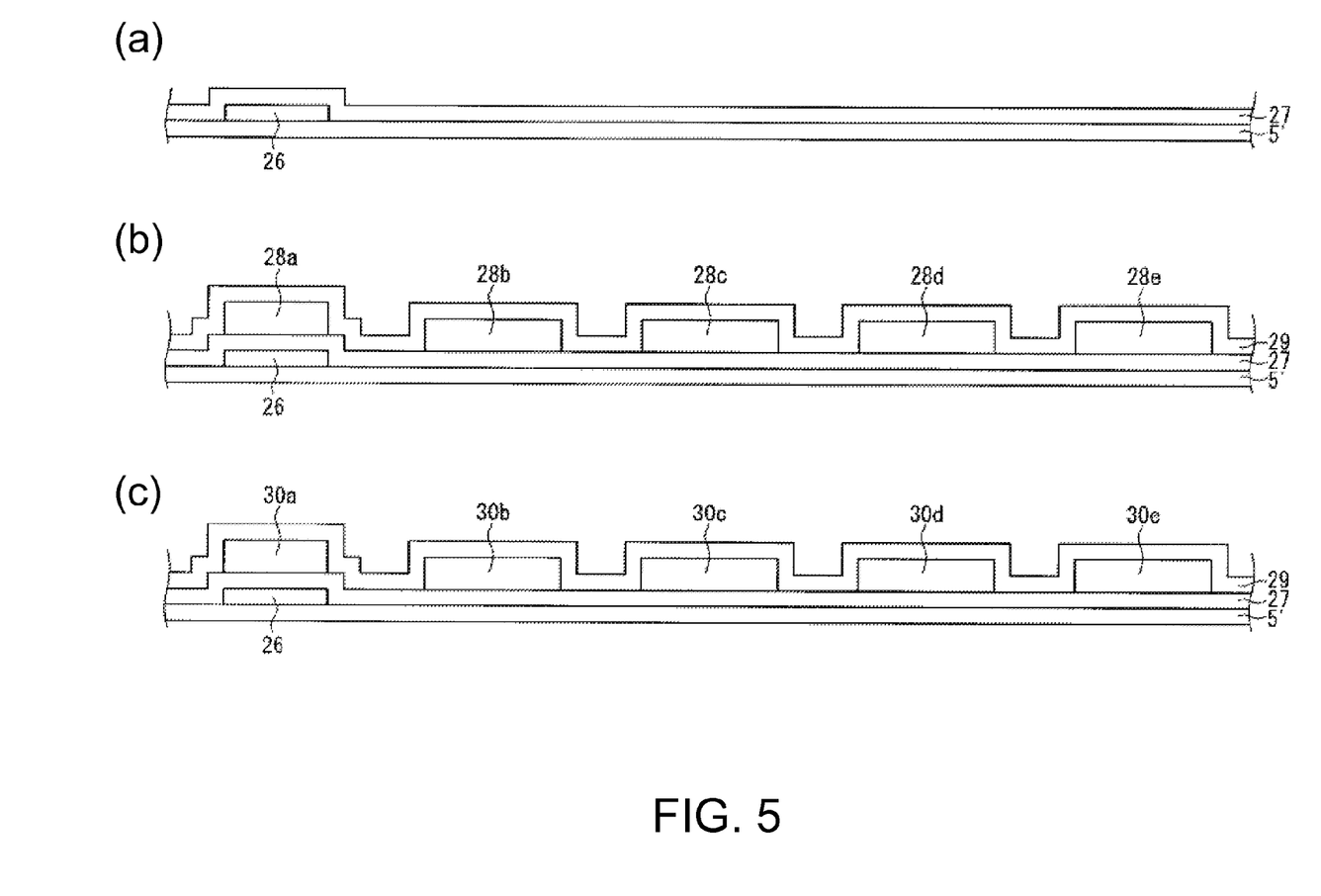
FIG. 5 is a drawing explaining process steps of a photodiode and thin film transistors provided in the aforementioned liquid crystal display device.
Figure 6:
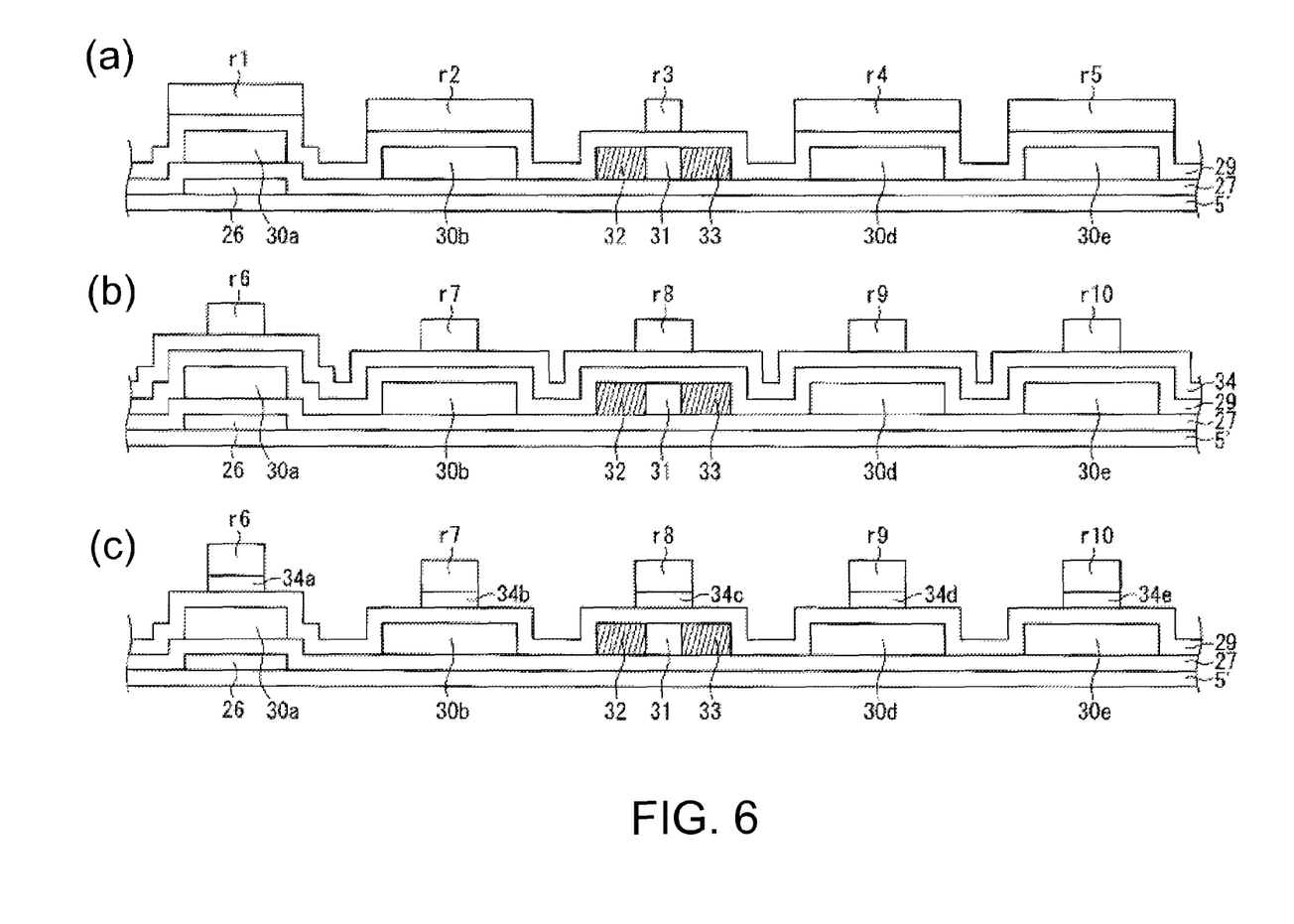
FIG. 6 is a drawing explaining process steps of the photodiode and the thin film transistors provided in the aforementioned liquid crystal display device.
Figure 7:
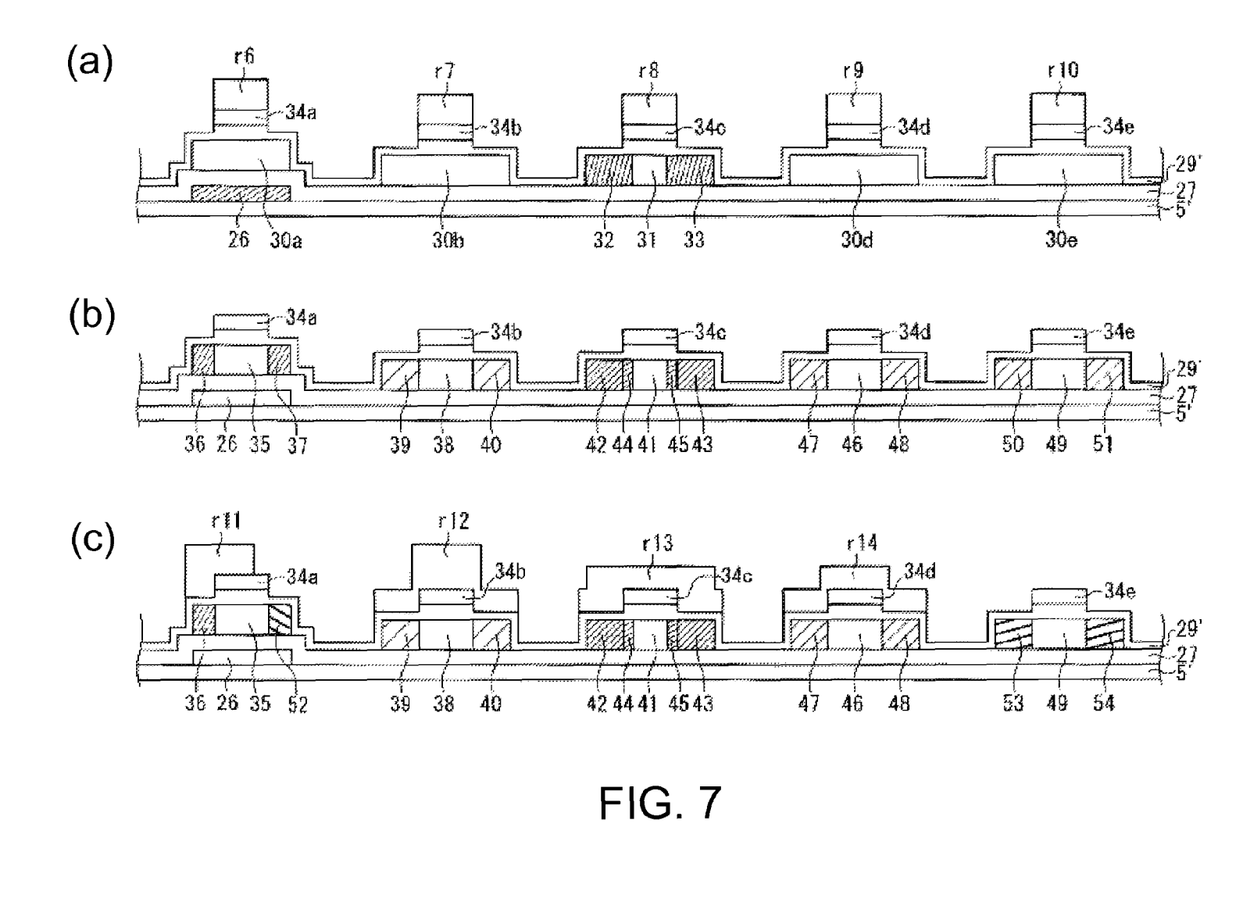
FIG. 7 is a drawing explaining process steps of the photodiode and the thin film transistors provided in the aforementioned liquid crystal display device.
Figure 8:
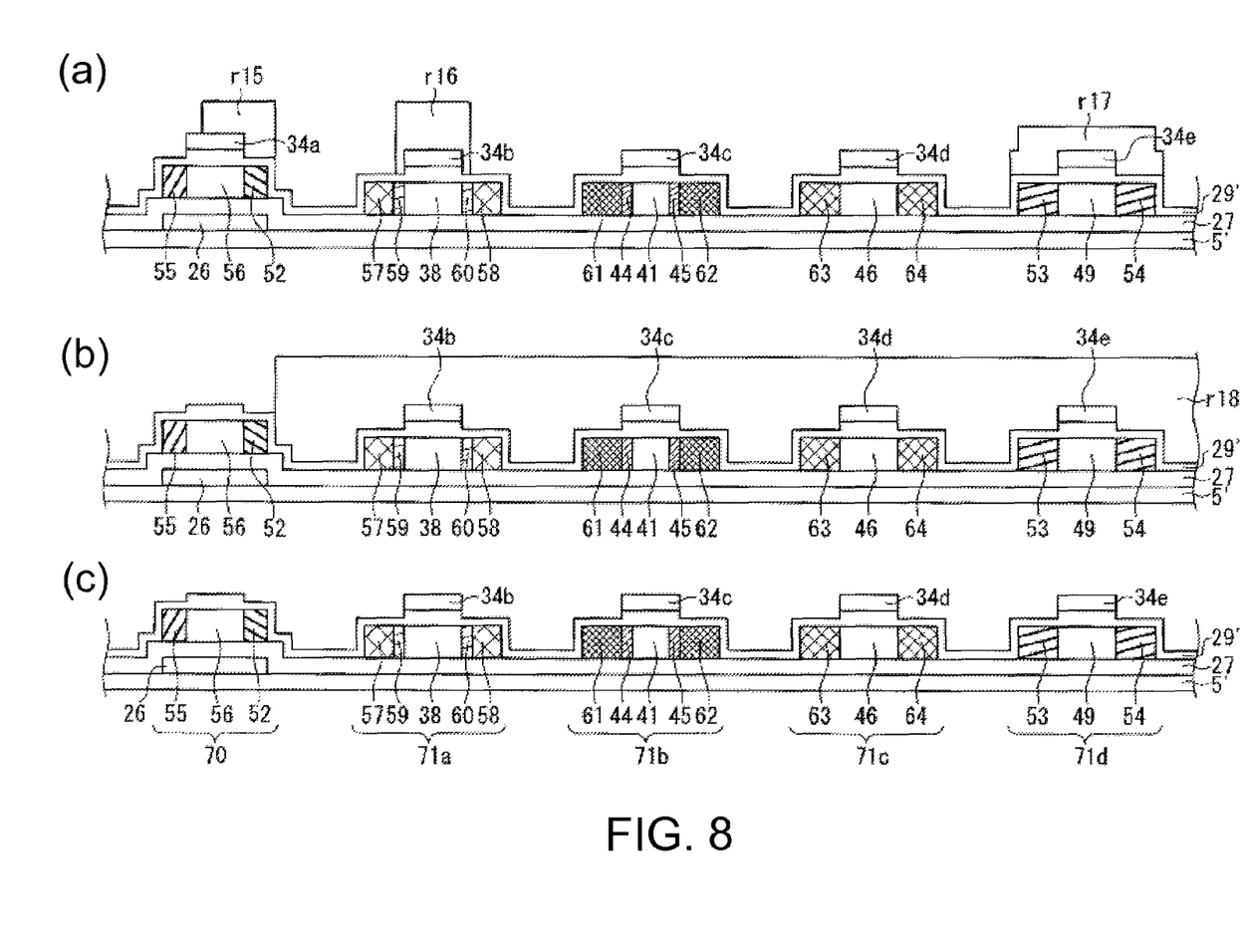
FIG. 8 is a drawing explaining process steps of the photodiode and the thin film transistors provided in the aforementioned liquid crystal display device.

FIG. 5 is a drawing explaining steps of manufacturing a photodiode and thin film transistors provided in the aforementioned liquid crystal display device. FIG. 5(a) to FIG. 5(c) explain a set of main process steps. FIG. 6 is a drawing explaining process steps of the photodiode and the thin film transistor provided in the aforementioned liquid crystal display device. FIG. 6(a) to FIG. 6(c) explain a set of main process steps performed after the step shown in FIG. 5(c). FIG. 7 is a drawing explaining process steps of the photodiode and the thin film transistors provided in the aforementioned liquid crystal display device. FIG. 7(a) to FIG. 7(c) explain a set of main process steps performed after the step shown in FIG. 6(c). FIG. 8 is a drawing explaining process steps of the photodiode and the thin film transistors provided in the aforementioned liquid crystal display device. FIG. 8(a) to FIG. 8(c) explain a set of main process steps performed after the step shown in FIG. 7(c).

A base substrate 5' constitutes a base material of the active matrix substrate 5. For the base substrate 5', other than a quartz substrate and a glass substrate, a substrate having an insulating surface, such as a Si substrate, a metal substrate, or the like, that has a surface coated with an insulating layer, is used.

As shown in FIG. 5(a), a light-shielding film 26 is formed on a portion of the surface of the base substrate 5' where the photodiode is to be formed. Then, an insulating film 27 is formed on the overall surface of the base substrate 5' including the light-shielding film 26.

For the light-shielding film 26, a metal film formed of a metal that has a high melting point, such as tantalum (Ta), tungsten (W), molybdenum (Mo), or the like, for example, is used. The light-shielding film 26 is formed to be 30 nm to 200 nm in thickness, for example. The light-shielding film 26 prevents light from entering the photodiode from the back surface direction of the substrate (lower direction in the figure). The insulating film 27 is formed of a silicon oxide film, a silicon nitride film, or a silicon oxynitride film, for example. The insulating film 27 is formed by a plasma CVD method, for example, to have a prescribed thickness (500 nm, for example). Other than the aforementioned description, when a substrate that is not transparent is used as the base substrate 5', the light-shielding film 26 may be omitted.

Next, as shown in FIG. 5(b), island-shaped first, second, third, fourth, and fifth semiconductor layers 28a, 28b, 28c, 28d, and 28e are formed on the insulating film 27. Then, a gate insulating film 29 that covers these semiconductor layers 28a to 28e is formed.

The first semiconductor layer 28a constitutes an active layer of the aforementioned photodiode. The second to fifth semiconductor layers 28b to 28e constitute the respective active layers of the aforementioned n-channel type TFT of LDD configuration, n-channel type TFT of GOLD configuration, n-channel type TFT of Single Drain configuration, and p-channel type TFT of Single Drain configuration, which are the first to fourth thin film transistors.

The first to fifth semiconductor layers 28a to 28e are formed using a crystalline silicon film. Specifically, first, using a known method such as a plasma CVD method, a sputtering method, or the like, a semiconductor film having an amorphous structure (here, an amorphous silicon film) is deposited. The thickness of the amorphous silicon film is set to 20 nm or more and 100 nm or less, for example. If the insulating film 27 and the amorphous silicon film are formed by the same method, they may be formed continuously. Then, the amorphous silicon film is crystallized to obtain a crystalline silicon film. Crystallization of the amorphous silicon film can be performed using a known method. The amorphous silicon film may be crystallized by irradiating the amorphous silicon film with laser light, for example. As laser light, excimer laser light of pulse oscillation type or continuous oscillation type is preferable. However, an argon laser light of continuous oscillation type may be used. Furthermore, a catalyst element (Ni or the like, for example) for facilitating crystallization may be attached to a surface of the amorphous silicon, and the amorphous silicon film may be crystallized by a thermal treatment (laser irradiation, for example). The obtained crystalline silicon film is patterned by photolithography and etching to obtain the first to fifth semiconductor layers 28a to 28e.

A silicon oxide ($SiO_2$) film of 100 nm thick, for example, is formed as the gate insulating film 29. Formation of the gate insulating film 29 may be performed using a CVD method, for example. Other than the aforementioned description, the gate insulating film 29 may be formed using a silicon nitride film, for example.

Next, in FIG. 5(c), a first or second conductive type (n-type or p-type) impurity is implanted to the first to fifth semiconductor layers 28a to 28e from above the gate insulating film 29 to adjust the resistance of the respective first to fourth thin film transistors. Specifically, on the overall surface of the gate insulating film 29, p-type low-concentration impurity ions (boron ions, for example), for example, are implanted to the first to fifth semiconductor layers 28a to 28e to adjust the resistance of the respective first to fourth thin film transistors. This way, the first to fifth semiconductor layers 28a to 28e become first to fifth semiconductor layers 30a to 30e, respectively. According to the aforementioned step, the resistance of the respective first to fourth thin film transistors can be set at appropriate values with ease. The accelerating voltage during boron ion implantation is set at 80 kV, and the dose amount is set at $1 \times 10^{13}/cm^2$, for example.

Next, as shown in FIG. 6(a), resists r1, r2, r3, r4, and r5 are formed as masks on the gate insulating film 29. Specifically, the resist r1, which is a fifth resist, is formed so as to cover the overall first semiconductor layer 30a, and the resist r2, which is a sixth resist, is formed so as to cover the overall second semiconductor layer 30b. The resist r3, which is a seventh resist, is formed so as to cover a portion of the third semiconductor layer 30c that becomes a channel region. In addition, the resist r4, which is a ninth resist, is formed so as to cover the overall fourth semiconductor layer 30d, and the resist r5, which is an eleventh resist, is formed so as to cover the overall fifth semiconductor layer 30e.

Then, n-type low-concentration impurity ions (phosphorus ions, for example) are implanted from above the resists r1 to r5 to form impurity implanted regions 32 and 33 in the third semiconductor layer 30c. The impurity implanted regions 32 and 33, as described later, become LDD regions, a source region, or a drain region of the GOLD configuration TFT. On the other hand, a region 31 of the third semiconductor layer 30c where phosphorus ions were not implanted becomes a channel region of the GOLD configuration TFT. In the first, second, fourth, and fifth semiconductor layers 30a, 30b, 30d, and 30e, implantation of phosphorus ions is prevented by the corresponding resists r1, r2, r4, and r5. The accelerating voltage during phosphorus ion implantation is set at 80 kV, and the dose amount is set at $1 \times 10^{13}/cm^2$, for example.

Next, as shown in FIG. 6(b), a gate metal 34 is formed on the gate insulating film 29 so as to cover the overall first to fifth semiconductor layers 30a to 30e. A tungsten film of 400 nm in thickness, for example, is used as the gate metal 34. This tungsten film is deposited on the gate insulating film 29 by a sputtering method. Then, resists r6, r7, r8, r9, and r10, which are masks, are formed on the gate metal 34. Specifically, the resist r6, which is a thirteenth resist, is formed at a portion that becomes a shield section above the first semiconductor layer 30a. The resist r7, which is a fourteenth resist, is formed on a portion that becomes a first gate electrode above the second semiconductor layer 30b. The resist r8, which is a fifteenth resist, is formed on a portion that becomes a second gate electrode above the third semiconductor layer 30c. Furthermore, the resist r9, which is a sixteenth resist, is formed on a portion that becomes a third gate electrode above the fourth semiconductor layer 30d, and the resist r10, which is a seventeenth resist, is formed on a portion that becomes a fourth gate electrode above the fifth semiconductor layer 30e.

Next, as shown in FIG. 6(c), the gate metal 34 is subjected to etching such as dry etching or the like to form a shield section 34a above the first semiconductor layer 30a and to form first to fourth gate electrodes 34b to 34e above the second to fifth semiconductor layers 30b to 30e, respectively.

Next, as shown in FIG. 7(a), the shield section 34a and the first to fourth gate electrodes 34b to 34e are subjected to etching such as dry etching or the like, for example. Furthermore, unnecessary gate metal 34 at the shield section 34a and at the first to fourth gate electrodes 34b to 34e can be removed securely. Moreover, as a result, the shield section 34a is formed to cover a portion of the first semiconductor layer 30a that becomes an intrinsic semiconductor region. The first gate electrode 34b is formed to cover a portion of the second semiconductor layer 30b that becomes a channel region. The second gate electrode 34c is formed to cover portions of the third semiconductor layer 30c that become a channel region and an LDD region. The third gate electrode 34d is formed to cover a portion of the fourth semiconductor layer 30d that becomes a channel region. The fourth gate electrode 34e is formed to cover a portion of the fifth semiconductor layer 30e that becomes a channel region.

Furthermore, by performing the aforementioned etching, the gate insulating film 29 becomes a gate insulating film 29' having a step-shaped pattern. The film thickness of exposed portions of the gate insulating film 29' is thinner than that of portions located below the shield section 34a or the first to fourth gate electrodes 34b to 34e, the former being approximately ⅓ of the latter. As shown in FIG. 8(c), which is shown later, the gate insulating film 29' is maintained in the step-shaped pattern even after the shield section 34a has been removed; however, it does not affect the photodiode at all. Furthermore, by performing a prescribed etching treatment as described above, the shield section 34a and the first to fourth gate electrodes 34b to 34e can be formed at appropriate locations with ease compared to a case in which the shield section 34a and the first to fourth gate electrodes 34b to 34e are formed by pinpointing by a sputtering method, for example.

Next, in FIG. 7(b), n-type low-concentration impurity ions (phosphorus ions, for example) are implanted from above the shield section 34a and the first to fourth gate electrodes 34b to 34e. Thus, in the step shown in FIG. 7(b), using the shield section 34a and the first to fourth gate electrodes 34b to 34e as resists (masks), the aforementioned low-concentration phosphorus ions are doped inside the first to fifth semiconductor layers 30a to 30e.

Specifically, in the first semiconductor layer 30a, low-concentration phosphorus ions are implanted into regions that are not covered by the shield section 34a to form impurity implanted regions 36 and 37. A region 35 of the first semiconductor layer 30a where phosphorus ions were not implanted becomes an intrinsic semiconductor region of the photodiode. Furthermore, in the second semiconductor layer 30b, low-concentration phosphorus ions are implanted into regions that are not covered by the first gate electrode 34b to form impurity implanted regions 39 and 40. A region 38 of the second semiconductor layer 30b where phosphorus ions were not implanted becomes a channel region of the LDD configuration TFT.

In the third semiconductor layer 30c, low-concentration phosphorus ions are implanted to regions that are not covered by the second gate electrode 34c to form impurity implanted regions 42 and 43. The region 31 of the third semiconductor layer 30c where phosphorus ions were not implanted becomes a channel region 41 and LDD regions 44 and 45 of a GOLD configuration TFT. In the fourth semiconductor layer 30d, low-concentration phosphorus ions are implanted to regions that are not covered by the third gate electrode 34d to form impurity implanted regions 47 and 48. A region 46 of the fourth semiconductor layer 30d where phosphorus ions were not implanted becomes a channel region of the Single Drain configuration TFT. In the fifth semiconductor layer 30e, low-concentration phosphorus ions are implanted into regions that are not covered by the fourth gate electrode 34e to form impurity implanted regions 50 and 51. A region 49 of the fifth semiconductor layer 30e where phosphorus ions were not implanted becomes a channel region of the Single Drain configuration TFT. The accelerating voltage during phosphorus ion implantation is set at 80 kV, and the dose amount is set at $1\times10^{13}/cm^2$, for example.

In a low-concentration phosphorus ion implantation step shown in FIG. 7(b), the shield section 34a is used as a resist (mask). Therefore, the productivity of the active matrix substrate 5 can be increased significantly compared to a case in which the shield section 34a is not provided. Specifically, if the shield section 34a is not formed, the first semiconductor layer 30a for the photodiode needs to be covered by a resist when performing the step of FIG. 7(b). In contrast, in the present embodiment, a photomask step for providing the aforementioned resist can be omitted once. Therefore, the production costs, lead time, and the yield decrease can be reduced by approximately 7%, respectively, thereby improving the productivity of the active matrix substrate 5 significantly.

Next, as shown in FIG. 7(c), resists r11, r12, r13, and r14, which are masks, are formed above the first to fourth semiconductor layers 30a to 30d. Specifically, the resist r11, which is a first resist, is formed so as to cover a left side portion of the first semiconductor layer 30a. The resist r11 functions as a mask along with the shield section 34a. The resist r12, which is a third resist, is formed so as to cover the overall second semiconductor layer 30b. The resist r13, which is an eighth resist, is formed so as to cover the overall third semiconductor layer 30c. The resist r14, which is a tenth resist, is formed so as to cover the overall fourth semiconductor layer 30d.

Then, p-type high-concentration impurity ions (boron ions, for example) are implanted from above the resists r11 to r14 and the fourth gate electrode 34e. This way, a p-type region 52 is formed at the right side portion of the first semiconductor layer 30a, and a source region 53 and a drain region 54 are formed in the fifth semiconductor layer 30e. In addition, in the first semiconductor layer 30a, the resist r11 and the shield section 34a prevent boron ions from being implanted into its left side portion and middle section. Furthermore, in the second to fourth semiconductor layers 30b to 30d, implantation of boron ions is prevented by the corresponding resists r12 to r14.

In the fifth semiconductor layer 30e, phosphorus ions have been injected in the previous step. Because of this, in order to form the p-type source region 53 and the drain region 54 in this step, counter-doping needs to be performed in the fifth semiconductor layer 30e. Therefore, the dose amount needs to be set higher. Specifically, the accelerating voltage during boron ion implantation is set at 80 kV, and the dose amount is set at $3\times10^{15}/cm^2$, for example.

Next, as shown in FIG. 8(a), resists r15, r16, and r17, which are masks, are formed above the first, second, and fifth semiconductor layers 30a, 30b, and 30e. Specifically, the resist r15, which is a second resist, is formed so as to cover a right side portion of the first semiconductor layer 30a. The resist r15 functions as a mask along with the shield section 34a. In addition, the resist r16, which is a fourth resist, is formed so as to cover a portion of the second semiconductor layer 30b that becomes a channel region and an LDD region, and the resist r17, which is a twelfth resist, is formed so as to cover the overall fifth semiconductor layer 30e.

Then, n-type high concentration impurity ions (phosphorus ions, for example) are implanted from above the resists r15 to r17 and the second and third gate electrodes 34c and 34d. This way, an n-type region 55 is formed on the left side portion of the first semiconductor layer 30a. Furthermore, in the first semiconductor layer 30a, the resist r15 and the shield section 34a prevent phosphorus ions from being implanted into its right side edge and middle section, and an intrinsic semiconductor region (i-layer) 56 is formed between the p-type region 52 and the n-type region 55.

In the second semiconductor layer 30b, a source region 57 and a drain region 58 are formed in portions that are not covered by the resist r16, and LDD regions 59 and 60 are formed in portions covered by the resist r16 such that the channel region 38 is interposed between the LDD regions 59 and 60. In the third semiconductor layer 30c, a source region 61 and a drain region 62 are formed in portions that are not covered by the second gate electrode 34c. In the fourth semiconductor layer 30d, a source region 63 and a drain region 64 are formed in portions that are not covered by the third gate electrode 34d. In the fifth semiconductor layer 30e, the resist r17 prevents phosphorus ions from being implanted. The accelerating voltage during phosphorus ion implantation is set at 80 kV, and the dose amount is set at $3×10^{15}/cm^2$, for example.

Other than the aforementioned description, the high-concentration boron ion implantation step shown in FIG. 7(c) and the high-concentration phosphorus ion implantation step shown in FIG. 8(a) may be performed in a reversed order.

Next, as shown in FIG. 8(b), a resist r18 is formed so as to cover the overall second to fifth semiconductor layers 30b to 30e excluding the first semiconductor layer 30a, and a step for removing the shield section 34a is performed. Then, the first or second conductive type (n-type or p-type) impurity is implanted into the first semiconductor layer 30a to adjust the resistance of the aforementioned photodiode. Specifically, p-type low-concentration impurity ions (boron ions, for example), for example, are implanted into the first semiconductor layer 30a from above the gate insulating film 29' to adjust the resistance of the aforementioned photodiode. This way, the resistance of the photodiode can be set at an appropriate value with ease. The accelerating voltage during boron ion implantation is set at 80 kV, and the dose amount is set at $1×10^{13}/cm^2$, for example.

Next, as shown in FIG. 8(c), the resist r18 is removed to form a photodiode 70, an LDD configuration n-channel type TFT 71a, a GOLD configuration n-channel type TFT 71b, a Single Drain configuration n-channel type TFT 71c, and a p-channel type Single Drain configuration TFT 71d.

Here, an "LDD region" in the present embodiment indicates a region in which the impurity concentration is $3×10^{17}$ atoms/cm$^3$ or more and is lower than the impurity concentration in a source region and a drain region. Therefore, a region of a semiconductor layer that contains an impurity at a very low concentration (less than $3×10^{17}$ atoms/cm$^3$) is not included in the LDD region. For example, there may be a case in which a part of an impurity implanted into an LDD region diffuses into a channel region located below a gate electrode. However, such a portion is not included in the LDD region because the impurity concentration in the portion where the impurity diffused is considered very low.

As described above, in the method of manufacturing the active matrix substrate (semiconductor device) 5 of the present embodiment, the shield section 34a is formed using the gate metal 34 so as to cover a portion of the photodiode 70 that becomes the intrinsic semiconductor region 56. As a result, variation in the channel length (dimension of the intrinsic semiconductor region 56 in the horizontal direction of FIG. 8(c)) of the photodiode 70, i.e., variation in output characteristics of the photodiode 70, can be suppressed. In forming a p-type region and an n-type region, if a resist is formed over a region that becomes an intrinsic semiconductor region in each of the steps of forming the p-type region and the n-type region, dimensional accuracy of the intrinsic semiconductor region is affected by dimensional accuracy and alignment of the respective resists. In contrast, as described above, in the method of forming the shield section 34a using the gate metal 34, the dimension of the intrinsic semiconductor region 56 is affected only by variation in the dimension of the shield section 34a and errors during etching. Therefore, variation in the dimension can be suppressed.

Figure 9:
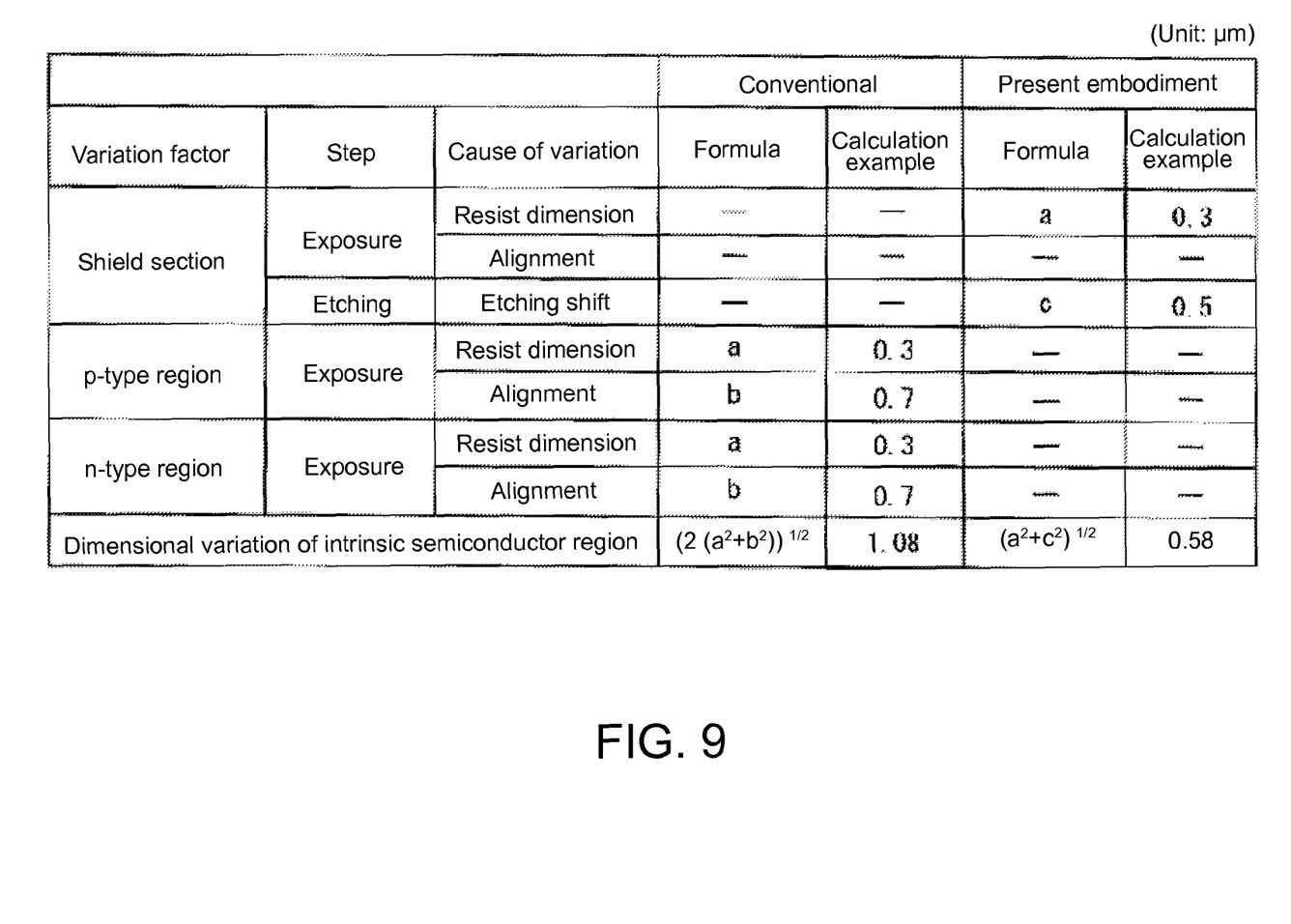
FIG. 9 is a drawing comparing variation in the dimension of an intrinsic semiconductor region between when a conventional method is used and when a method according to the present embodiment is used.

Specifically, as shown in FIG. 9, according to the conventional method, dimensional variation of the intrinsic semiconductor region $(2(a^2+b^2)^{1/2})$ was determined by dimensional variations a and a and alignment variations b and b of the respective resists when forming the p-type region and the n-type region. In contrast, according to the method of the present embodiment, a dimensional variation a of the resist when forming the shield section 34a and a dimensional variation c at the time of etching mainly affect the dimensional variation $((a^2+c^2)^{1/2})$ of the intrinsic semiconductor region 56. Therefore, as shown in FIG. 9, the dimensional variation of the intrinsic semiconductor region can be reduced compared to the conventional method by using the method of the present embodiment. In the example of FIG. 9, the dimensional variation of the intrinsic semiconductor region was 1.08 μm when the conventional method was used. The variation can be reduced to 0.58 μm by using the method of the present embodiment.

Here, in FIG. 9, dimensional variations in the respective steps are values obtained by taking into account 3σ relative to the average value of dimensional errors. In addition, in FIG. 9, dimensional variations of the intrinsic semiconductor region according to the conventional example and the present embodiment are values calculated by equations in the table.

In the present embodiment, the p-type region 52 and the n-type region 55 (first and second conductive type regions) are formed in the aforementioned first semiconductor layer 30a using the shield section 34a as a resist (mask), and then, the shield section 34a is removed. Because of this, decrease in the light-receiving area of the intrinsic semiconductor region 56 and resulting decrease in the amount of light entering the intrinsic semiconductor region 56, which occur in the aforementioned conventional example, can be prevented. Therefore, lowering of photocurrent flowing into the photodiode 70 can be prevented. In addition, in the present embodiment, even when the shield section 34a is formed using dry etching, etching damages in the shield section edges are on the p-type region 52 and the n-type region 55. Because of this, unlike the conventional example, lowering of the S/N ratio does not occur in output of the photodiode 70. As a result, according to the present embodiment, the high-performance photodiode 70 in which variation in output characteristics and lowering of detection accuracy are suppressed can be formed.

The aforementioned embodiments are all shown as examples, and are not limiting. Technical scope of the present invention is specified by the scope of claims, and all modifications within the scope that are equivalent to the configurations described therein are also included in the technical scope of the present invention.

For example, in the aforementioned description, a case in which the aforementioned manufacture method is applied to the manufacture of an active matrix substrate that is used in a liquid crystal display device equipped with a touch panel was described. However, the aforementioned manufacture method is not limited to a method of manufacturing an active matrix substrate that is used in a liquid crystal display device equipped with a touch panel as long as it is a method of manufacturing a semiconductor device in which a photodiode and a thin film transistor are formed on a single substrate. Specifically, it can be applied to a method of manufacturing various display devices, such as semi-transmissive and reflective liquid crystal panels, organic EL (Electronic Luminescence) element, inorganic EL element, field emission displays, and the like, as well as active matrix substrates used in them. Moreover, it can be applied to a method of manufacturing a semiconductor device in which a photodiode is used as an illuminance sensor (ambient sensor) to detect outside light.

Furthermore, in the aforementioned description, a case in which a photodiode and four types of thin film transistors having mutually different configurations are formed on a single substrate was described. However, the types and the number of thin film transistors formed on the same substrate as the photodiode are not limited to the aforementioned types and number. Thus, any configuration is possible as long as it uses a gate metal to form a shield section and a gate electrode over a semiconductor layer for a photodiode and over a semiconductor layer for a thin film transistor, respectively, and uses the shield section as a resist (mask). Specifically, a photodiode and any one type of the aforementioned four types of thin film transistors may be formed on a single substrate, for example.

INDUSTRIAL APPLICABILITY

The present invention is useful with respect to a method of manufacturing a semiconductor device that can form a high-performance photodiode in which variation in output characteristics and performance deterioration are suppressed.

DESCRIPTION OF REFERENCE CHARACTERS 5 active matrix substrate (semiconductor device)
5' base substrate
28a to 28e, 30a to 30e first to fifth semiconductor layers
29, 29' gate insulating films
32, 33, 36, 37, 39, 40, 42, 43, 47, 48, 50, 51 impurity implanted regions
34a shield section
34b to 34e first to fourth gate electrodes
38, 41, 46, 49 channel regions
44, 45, 59, 60 low-concentration impurity regions (LDD regions)
52 p-type region (second conductive type region)
55 n-type region (first conductive type region)
56 intrinsic semiconductor region
53, 57, 61, 63 source regions
54, 58, 62, 64 drain regions
70 photodiode
71a to 71d first to fourth thin film transistors
r1 to r18 resists

The invention claimed is:

1. A method of manufacturing a semiconductor device having a photodiode and a thin film transistor on a same substrate, the method comprising:
  (a) forming a first semiconductor layer for said photodiode and a second semiconductor layer for said thin film transistor on said substrate;
  (b) forming a gate insulating film that covers said first and second semiconductor layers;
  (c) forming a first gate electrode that covers a portion of said second semiconductor layer that becomes a channel region on said gate insulating film using a prescribed gate metal, and forming a shield section that covers a portion of said first semiconductor layer that becomes an intrinsic semiconductor region on said gate insulating film using said gate metal;
  (d) implanting a first conductive type impurity into said first and second semiconductor layers from above said gate insulating film to form a region where said first conductive type impurity is implanted in a region of said first semiconductor layer that is not covered by said shield section and to form a region where said first conductive type impurity is implanted in a region of said second semiconductor layer that is not covered by said first gate electrode;
  (e) forming a first resist having an opening that exposes a portion of said gate insulating film, which covers said first semiconductor layer, and implanting a second conductive type impurity from above said gate insulating film to form a second conductive type region in a region of said first semiconductor layer that is not covered by said shield section or said first resist;
  (f) forming a second resist that covers said second conductive type region of said first semiconductor layer and implanting said first conductive type impurity from above said gate insulating film to form a first conductive type region in a region of said first semiconductor layer that is not covered by said shield section or said second resist; and
  (g) removing said shield section,
    wherein in said step (e), a third resist that entirely covers said second semiconductor layer is formed to prevent said second conductive type impurity from being implanted into said second semiconductor layer,
    wherein in said step (f), a fourth resist having an opening that exposes portions of said gate insulating film that are located on both sides of said second semiconductor layer with said gate electrode located therebetween in a plan view is formed so that one and the other of a source region and a drain region are respectively formed in regions of said both sides of said second semiconductor layer that are not covered by said first gate electrode or said fourth resist, and a region of said second semiconductor layer that is covered by said fourth resist becomes a low-concentration impurity region to form a first conductive type thin film transistor having an LDD configuration as a first of said thin film transistor,
    wherein in said step (a), a third semiconductor layer for a second thin film transistor is formed on said substrate,
    wherein in said step (b), a gate insulating film that covers said first to third semiconductor layers is formed,
    wherein before performing said step (c), the method further includes a step (h) of forming fifth and sixth resists that respectively cover said first and second semiconductor layers entirely and forming a seventh resist that covers a portion of said third semiconductor layer that becomes a channel region, and implanting a first conductive type impurity into said third semiconductor layer from above said gate insulating film to form a region in which said first conductive type impurity is implanted in a region of said third semiconductor layer that is not covered by said seventh resist,
    wherein in said step (c), a second gate electrode that covers portions of said third semiconductor layer that become a channel region and a low-concentration impurity region is formed on said gate insulating film using said gate metal,
    wherein in said step (d), said channel region and said low-concentration impurity region are formed in a region that is covered by said second gate electrode,
    wherein said step (e), an eighth resist that entirely covers said third semiconductor layer is formed to prevent said second conductive type impurity from being implanted to said third semiconductor layer, and
    wherein in said step (f), one and the other of a source region and a drain region are respectively formed in regions of said third semiconductor layer that are not covered by said second gate electrode to form a first conductive type thin film transistor having a GOLD configuration as said second thin film transistor.

2. The method of manufacturing a semiconductor device according to claim 1, wherein in said step (a), a fourth semiconductor layer for a third thin film transistor is formed on said substrate, wherein in said step (b), a gate insulating film that covers said first to fourth semiconductor layers is formed, wherein in said step (h), a ninth resist that entirely covers said fourth semiconductor layer is formed, wherein in said step (c), a third gate electrode that covers a portion of said fourth semiconductor layer that becomes a channel region is formed on said gate insulating film using said gate metal, wherein in said step (d), a region in which said first conductive type impurity is implanted is formed in a region of said fourth semiconductor layer that is not covered by said third gate electrode, wherein in said step (e), a tenth resist that entirely covers said fourth semiconductor layer is formed to prevent said second conductive type impurity from being implanted to said fourth semiconductor layer, and wherein in said step (f), one and the other of a source region and a drain region are respectively formed in regions of said fourth semiconductor layer that are not covered by said third gate electrode to form a first conductive type thin film transistor having a Single Drain configuration as said third thin film transistor.

3. The method of manufacturing a semiconductor device according to claim 2, wherein in said step (a), a fifth semiconductor layer for a fourth thin film transistor is formed on said substrate, wherein in said step (b), a gate insulating film that entirely covers said first to fifth semiconductor layers is formed, wherein in said step (h), an eleventh resist that entirely covers said fifth semiconductor layer is formed, wherein in said step (c), a fourth gate electrode that covers a portion of said fifth semiconductor layer that becomes a channel region is formed on said gate insulating film using said gate metal, wherein in said step (d), a region in which said first conductive type impurity is implanted is formed in a region of said fifth semiconductor layer that is not covered by said fourth gate electrode, wherein in said step (e), one and the other of a source region and a drain region are respectively formed in regions of said fifth semiconductor layer that are not covered by said fourth gate electrode to form a second conductive type thin film transistor as said fourth thin film transistor, and wherein in said step (f), a twelfth resist that entirely covers said fifth semiconductor layer is formed to prevent said first conductive type impurity from being implanted to said fifth semiconductor layer.

4. The method of manufacturing a semiconductor device according to claim 3, wherein in said step (c), after said gate metal is formed on said gate insulating film so as to entirely cover said first to fifth semiconductor layers, thirteenth, fourteenth, fifteenth, sixteenth, and seventeenth resists are formed at portions that become said shield section, said first, said second, said third, and said fourth gate electrodes, respectively, and a prescribed etching treatment is performed to form said shield section and said first to fourth gate electrodes on said gate insulating film.

5. The method of manufacturing a semiconductor device according to claim 3, wherein after said step (b), the method further includes a step (i) of implanting said first or said second conductive type impurity into said first to fifth semiconductor layers from above said gate insulating film to adjust a resistance of said respective first to fourth thin film transistors.

6. The method of manufacturing a semiconductor device according to claim 1, wherein after said step (g), the method further includes a step (j) of implanting said first or said second conductive type impurity into said first semiconductor layer from above said gate insulating film to adjust a resistance of said photodiode.

7. The method of manufacturing a semiconductor device according to claim 1, wherein said first conductive type is an n-type and said second conductive type is a p-type.

* * * * *